(12) United States Patent
Jang et al.

(10) Patent No.: US 6,989,690 B1
(45) Date of Patent: Jan. 24, 2006

(54) METHODS OF IMPLEMENTING SCALABLE ROUTING MATRICES FOR PROGRAMMABLE LOGIC DEVICES

(75) Inventors: Tetse Jang, San Jose, CA (US); Scott Te-Sheng Lien, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 28 days.

(21) Appl. No.: 10/869,589

(22) Filed: Jun. 15, 2004

(51) Int. Cl.
*H03K 19/177* (2006.01)

(52) U.S. Cl. .............................. 326/41; 326/38; 716/16; 716/18

(58) Field of Classification Search ................. 326/38, 326/41; 716/16, 18
See application file for complete search history.

(56) References Cited

U.S. PATENT DOCUMENTS 5,671,432 A * 9/1997 Bertolet et al. ............... 712/11
6,594,816 B1 * 7/2003 Hauck ............................ 716/18

* cited by examiner

*Primary Examiner*—Daniel Chang
(74) *Attorney, Agent, or Firm*—Lois D. Cartier

(57) ABSTRACT

Methods of implementing routing matrices for programmable logic devices (PLDs). Each method includes generating a seed matrix, a distribution matrix, adjustment values for the distribution matrix, and a routing matrix pattern. The seed matrix and distribution matrix are implemented according to a set of rules that define valid matrices. The routing matrix is then implemented by applying the routing matrix pattern to provide programmable interconnections between input and output terminals of the routing matrix. Each signal value in the routing matrix pattern corresponds to one of the input terminals, and each row of signal values in the routing matrix pattern corresponds to a set of the input terminals programmably coupled to a different one of the output terminals. By adding additional columns of sub-matrices to an existing distribution matrix, an existing routing matrix can also be expanded to accommodate a larger number of input signals.

38 Claims, 10 Drawing Sheets

| A | B | C | D | E | F | G | H | I | J | K | L | M |
|---|---|---|---|---|---|---|---|---|---|---|---|---|
| 0 | 1 | 2 | 3 | 4 | 5 | 6 | 7 | 8 | 9 | 10 | 11 | 12 |
| 1 | 2 | 5 | 10 | 9 | 3 | 12 | 0 | 7 | 11 | 6 | 8 | 4 |
| 2 | 5 | 3 | 6 | 11 | 10 | 4 | 1 | 0 | 8 | 12 | 7 | 9 |
| 3 | 10 | 6 | 4 | 7 | 12 | 11 | 5 | 2 | 0 | 9 | 1 | 8 |
| 4 | 9 | 11 | 7 | 5 | 8 | 1 | 12 | 6 | 3 | 0 | 10 | 2 |
| 5 | 3 | 10 | 12 | 8 | 6 | 9 | 2 | 1 | 7 | 4 | 0 | 11 |
| 6 | 12 | 4 | 11 | 1 | 9 | 7 | 10 | 3 | 2 | 8 | 5 | 0 |
| 7 | 0 | 1 | 5 | 12 | 2 | 10 | 8 | 11 | 4 | 3 | 9 | 6 |
| 8 | 7 | 0 | 2 | 6 | 1 | 3 | 11 | 9 | 12 | 5 | 4 | 10 |
| 9 | 11 | 8 | 0 | 3 | 7 | 2 | 4 | 12 | 10 | 1 | 6 | 5 |
| 10 | 6 | 12 | 9 | 0 | 4 | 8 | 3 | 5 | 1 | 11 | 2 | 7 |
| 11 | 8 | 7 | 1 | 10 | 0 | 5 | 9 | 4 | 6 | 2 | 12 | 3 |
| 12 | 4 | 9 | 8 | 2 | 11 | 0 | 6 | 10 | 5 | 7 | 3 | 1 |

FIG. 6

DISTRIBUTION MATRIX

| A | D | G | J | M | | G |
|---|---|---|---|---|---|---|
| B | E | H | K | A | ••• | K |
| C | F | I | L | B | | D |

+

ADJUSTMENT MATRIX

| 0 | 13 | 26 | 39 | 52 | ••• |
|---|----|----|----|----|-----|

FIG. 7

| | | SIGNALS (0-64) | | | |
|---|---|---|---|---|---|
| MUX0 | 0 | 16 | 32 | 48 | 64 |
| MUX1 | 1 | 23 | 38 | 50 | 56 |
| MUX2 | 2 | 19 | 30 | 47 | 61 |
| MUX3 | 3 | 17 | 37 | 39 | 60 |
| MUX4 | 4 | 20 | 27 | 42 | 54 |
| MUX5 | 5 | 25 | 35 | 46 | 63 |
| MUX6 | 6 | 24 | 33 | 41 | 52 |
| MUX7 | 7 | 18 | 36 | 43 | 58 |
| MUX8 | 8 | 15 | 29 | 51 | 62 |
| MUX9 | 9 | 13 | 28 | 49 | 57 |
| MUX10 | 10 | 22 | 34 | 40 | 59 |
| MUX11 | 11 | 14 | 31 | 45 | 55 |
| MUX12 | 12 | 21 | 26 | 44 | 53 |
| MUX13 | 1 | 17 | 33 | 49 | 52 |
| MUX14 | 2 | 22 | 26 | 45 | 53 |
| MUX15 | 5 | 24 | 27 | 51 | 54 |
| MUX16 | 10 | 20 | 31 | 48 | 55 |
| MUX17 | 9 | 18 | 38 | 39 | 56 |
| MUX18 | 3 | 21 | 28 | 43 | 57 |
| MUX19 | 12 | 14 | 36 | 47 | 58 |
| MUX20 | 0 | 25 | 34 | 42 | 59 |
| MUX21 | 7 | 19 | 37 | 44 | 60 |
| MUX22 | 11 | 16 | 30 | 40 | 61 |
| MUX23 | 6 | 13 | 29 | 50 | 62 |
| MUX24 | 8 | 23 | 35 | 41 | 63 |
| MUX25 | 4 | 15 | 32 | 46 | 64 |
| MUX26 | 2 | 18 | 34 | 50 | 53 |
| MUX27 | 5 | 16 | 33 | 47 | 54 |
| MUX28 | 3 | 23 | 26 | 46 | 57 |
| MUX29 | 6 | 25 | 28 | 40 | 62 |
| MUX30 | 11 | 21 | 32 | 49 | 61 |
| MUX31 | 10 | 19 | 27 | 39 | 55 |
| MUX32 | 4 | 22 | 29 | 44 | 64 |
| MUX33 | 1 | 15 | 37 | 48 | 52 |
| MUX34 | 0 | 14 | 35 | 43 | 59 |
| MUX35 | 8 | 20 | 38 | 45 | 63 |
| MUX36 | 12 | 17 | 31 | 41 | 58 |
| MUX37 | 7 | 13 | 30 | 51 | 60 |
| MUX38 | 9 | 24 | 36 | 42 | 56 |

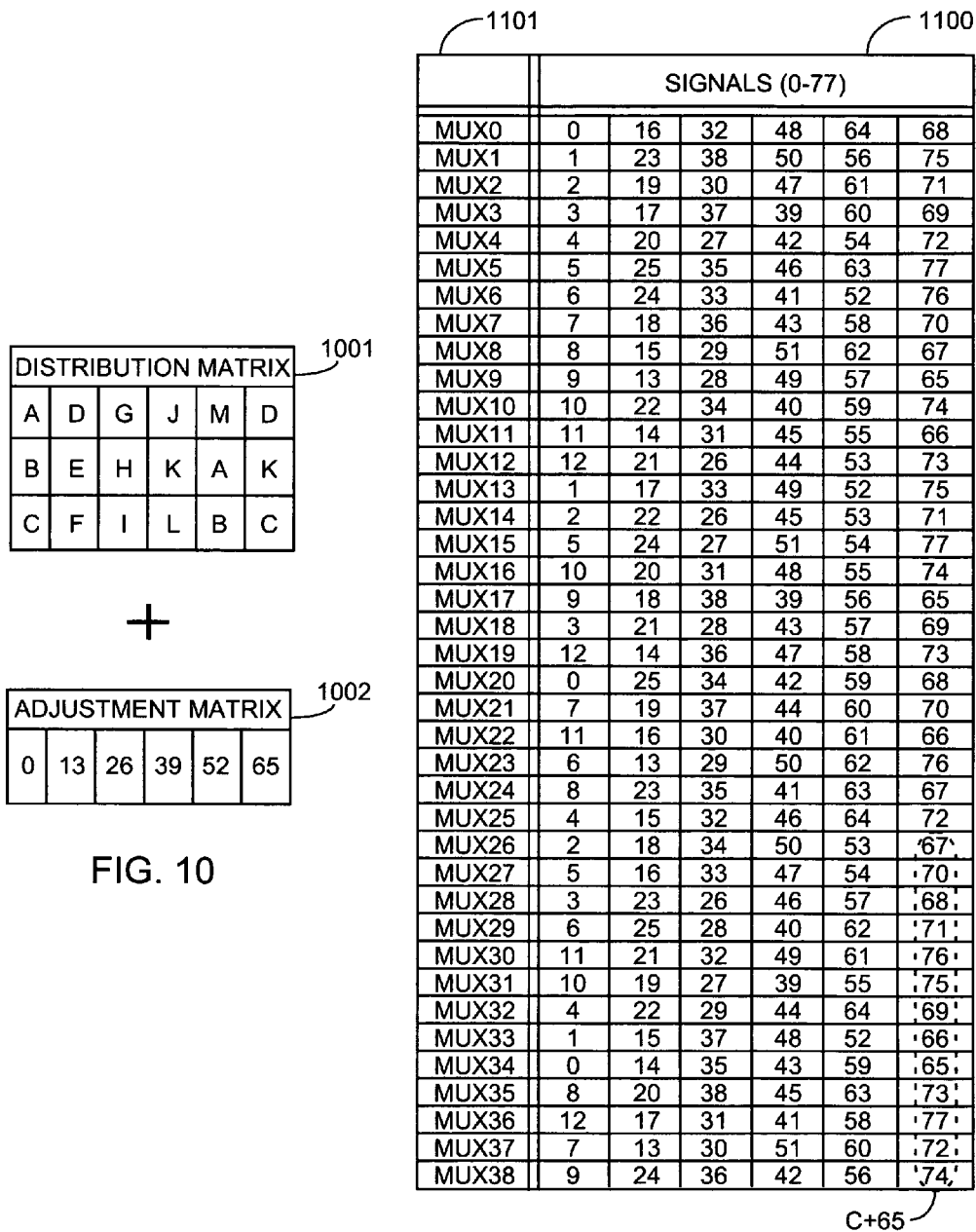

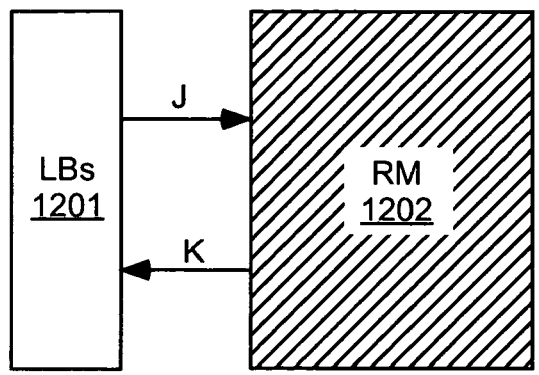
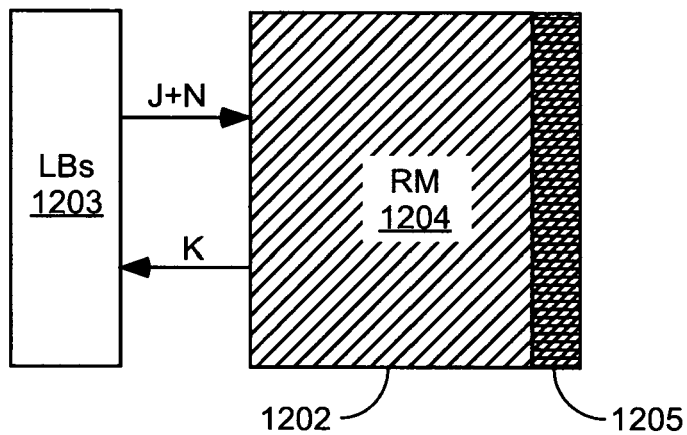
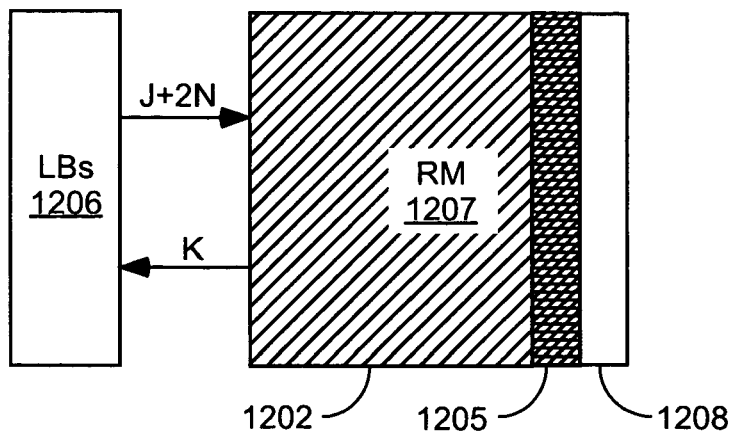
FIG. 12

METHODS OF IMPLEMENTING SCALABLE ROUTING MATRICES FOR PROGRAMMABLE LOGIC DEVICES

FIELD OF THE INVENTION

The invention relates to programmable logic devices (PLDs). More particularly, the invention relates to a scalable routing matrix that can be utilized in a PLD.

BACKGROUND OF THE INVENTION

Programmable logic devices (PLDs) are a well-known type of integrated circuit that can be programmed to perform specified logic functions. One type of PLD, the Complex Programmable Logic Device (CPLD), typically includes two or more logic blocks (function blocks) interconnected by an interconnect switch matrix, or routing matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration sequence.

Another type of PLD is the Field Programmable Gate Array, or FPGA. An FPGA also includes both programmable logic blocks and a programmable interconnect structure interconnecting the logic blocks. The programmable functions in FPGAs are most commonly controlled by configuration data stored in static memory cells.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

FIG. 1 illustrates an exemplary well-known CPLD. The CPLD of FIG. 1 includes a routing matrix (RM) 101, a plurality of function blocks 102–102n, a corresponding plurality of input/output (I/O) blocks (IOBs) 103–103n, and supporting logic such as boundary scan and in-system programming logic (BSC & ISP) 106. I/O pads 104–104n are coupled to respective IOBs 103–103n, which in turn communicate with function blocks 102–102n. Function blocks 102–102n communicate with routing matrix 101. Each function block includes a PLA AND/OR plane and a plurality of macrocells MC1–MC16.

Clock and control signals (CLOCK & CTRL SIGNALS) 109 are provided to function blocks 102–102n and I/O blocks 103–103n. In some CPLDs, a boundary scan path (BSC PATH) 108 connects the I/O blocks 103–103n in a boundary scan chain for testing and/or programming purposes via boundary scan I/O pads 107. In some CPLDs, fast input connections 105–105n optionally provide faster interconnections between IOBs 103–103n, function blocks 102–102n, and routing matrix 101. (Note that in the present specification, the same reference characters are used to refer to terminals, signal lines, and their corresponding signals.)

Clearly, the larger the number of programmable interconnections provided by routing matrix 101, the easier it will be to implement large amounts of logic in the CPLD, e.g., fully utilizing all of the available macrocells and function blocks. However, an overly large routing matrix, such as a routing matrix providing every possible interconnection between every input terminal and every output terminal of the matrix, would adversely affect the cost of the CPLD. Therefore, most CPLDs support only a subset of the possible interconnections, as shown, for example, in FIGS. 2–3.

FIG. 2 illustrates a small routing matrix having twelve input signals 0–11 and six output signals MUX0 through MUX5. Output signals MUX0 through MUX5 are provided by six corresponding multiplexers 200–205. Each of multiplexers 200–205 has four input signals selected from the twelve input signals 0–11. The selection of an input signal as an input to a multiplexer is shown as an open circle (e.g., circle 206) at the intersection of the signal line and the input line to the multiplexer. For example, output signal MUX0 is provided by multiplexer 200 from any of input signals 0, 3, 6, and 9. Multiplexers 201–205 are driven by their selected input signals as shown in FIG. 2.

FIG. 3 illustrates the same routing matrix as FIG. 2, but in the form of a routing matrix pattern. By comparing FIGS. 2 and 3, it is clear that each numerical value in routing matrix pattern 300 corresponds to one of the input signals 0–11 shown in FIG. 2, and each row of values in routing matrix pattern 300 corresponds to a set of input terminals coupled to a different multiplexer 200–205 to provide output signals MUX0–MUX5.

The exemplary routing matrix shown in FIGS. 2 and 3 is a straightforward implementation that provides little routing flexibility. There are many routing combinations (corresponding to many logical circuits) that cannot be routed using the pictured routing matrix. For example, if a CPLD user wishes to route the three input signals 0, 3, and 6 to three of the output multiplexers, the design will fail to route. In this example, signal 0 can be routed to output terminal MUX0, and signal 3 can be routed to output terminal MUX3, but signal 6 cannot be provided to any of the remaining output terminals MUX1, MUX2, MUX4, or MUX5.

FIGS. 4 and 5 illustrate a more versatile routing matrix than that of FIGS. 2 and 3. As shown in FIG. 4, this routing matrix is the same size as that of the previous example, also having twelve input signals 0–11 and six output signals MUX0 through MUX5. Output signals MUX0 through MUX5 are provided by six corresponding multiplexers 400–405. Each of multiplexers 400–405 has four input signals selected from the twelve input signals 0–11. Again, the selection of an input signal as an input to a multiplexer is shown as an open circle (e.g., circle 406) at the intersection of the signal line and the input line to the multiplexer. For example, output signal MUX0 is provided by multiplexer 400 from any of input signals 0, 3, 6, and 11. Multiplexers 401–405 are driven by their selected input signals as shown in FIG. 4.

FIG. 5 illustrates the same routing matrix as FIG. 4, but in the form of a routing matrix pattern. By comparing FIGS. 4 and 5, it is clear that each numerical value in routing matrix pattern 500 corresponds to one of the input signals 0–11 shown in FIG. 4, and each row of values in routing matrix pattern 500 corresponds to a set of input terminals coupled to a different multiplexer 400–405 to provide output signals MUX0–MUX5.

Note that the less repetitive nature of the selected signals in the example of FIGS. 4–5 results in a more flexible routing matrix. For example, unlike the routing matrix of FIGS. 2 and 3, the routing matrix of FIGS. 4 and 5 can route the three signals 0, 3, and 6 successfully. Signal 0 can be routed to output terminal MUX0, signal 3 can be routed to output terminal MUX5, and signal 6 can be routed to output terminal MUX4.

The routing matrix illustrated in FIGS. 4 and 5 is flexible, but it is also small. Deriving a suitable pattern of programmable interconnections is relatively simple for a routing matrix of this size. However, PLD routing matrices are typically much larger than these simple examples. Further, it is frequently desirable to produce "families" of related PLDs having routing matrices of varying sizes. Each routing matrix must be laid out, and routing software must be developed to support each of the routing matrices. Therefore, the process of creating and supporting routing matrices for each member of a PLD family can be a significant task. It is desirable, therefore, to provide methods of implementing routing matrices that simplify these tasks while providing flexible routing options to the PLD user.

SUMMARY OF THE INVENTION

The invention provides methods of implementing routing matrices for programmable logic devices (PLDs). Each method includes generating a seed matrix, a distribution matrix, adjustment values for the distribution matrix, and a routing matrix pattern. The routing matrix is then implemented using the routing matrix pattern.

The seed matrix includes N rows and N columns of numerical signal values, where N is an integer greater than one, e.g., a prime number. Each signal value appears at most once in each column and at most once in each row of the seed matrix. The distribution matrix includes S rows and T columns of sub-matrices, where each sub-matrix corresponds to a column of the seed matrix. Each column of the distribution matrix differs from each other column of the distribution matrix in at least (S−1) of the sub-matrices in the column. Each column of the distribution matrix has a corresponding adjustment value, where each adjustment value is an integral multiple of N. A routing matrix pattern is generated by adding the corresponding adjustment value to each signal value in each sub-matrix in each column of the distribution matrix.

The routing matrix for the PLD is generated by applying the routing matrix pattern to provide programmable interconnections between input and output terminals of the routing matrix. Each signal value in the routing matrix pattern corresponds to one of the input terminals, and each row of signal values in the routing matrix pattern corresponds to a set of the input terminals programmably coupled to a different one of the output terminals.

The routing matrices generated using the methods of the invention are both flexible and scalable. By adding additional columns of sub-matrices to an existing distribution matrix, an existing routing matrix can be expanded to accommodate a larger number of input signals. Hardware and software implementation of the new and larger routing matrices is simplified by maintaining this relationship between the variously-sized routing matrices. For example, this method can be used to create a set of PLDs (e.g., a family of CPLDs) of graduated sizes.

The invention also encompasses products (e.g., routing matrices and PLDs) generated utilizing the methods described herein.

BRIEF DESCRIPTION OF THE DRAWINGS

The present invention is illustrated by way of example, and not by way of limitation, in the following figures.

FIG. 6 illustrates an exemplary seed matrix that can be used to generate a routing matrix.

FIG. 7 illustrates exemplary generalized distribution and adjustment matrices that can be applied, for example, to the seed matrix of FIG. 6 to generate a routing matrix.

FIG. 8 illustrates exemplary first distribution and adjustment matrices that can be applied, for example, to the seed matrix of FIG. 6 to generate a routing matrix.

FIG. 9 illustrates the routing matrix pattern that results from the application of FIG. 8 to the seed matrix of FIG. 6.

FIG. 10 illustrates exemplary second distribution and adjustment matrices that can be applied, for example, to the seed matrix of FIG. 6 to generate a routing matrix.

FIG. 11 illustrates the routing matrix pattern that results from the application of FIG. 10 to the seed matrix of FIG. 6.

FIG. 12 illustrates an exemplary set of related PLDs created by applying the methods of the present invention.

DETAILED DESCRIPTION OF THE DRAWINGS

Figure 1:
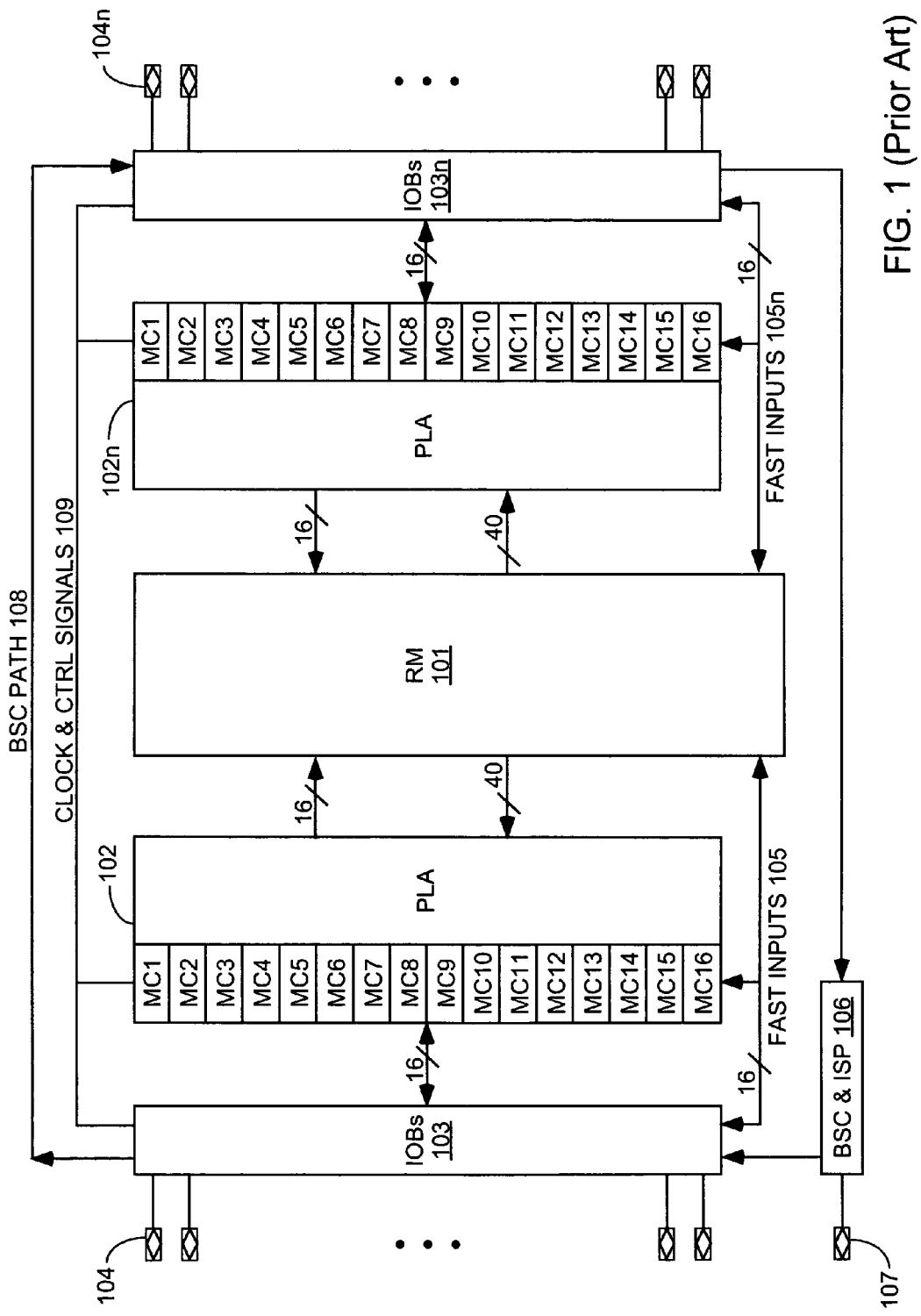
FIG. 1 illustrates an exemplary well-known Complex Programmable Logic Device (CPLD).

In the following description, numerous specific details are set forth to provide a more thorough understanding of the present invention. However, it will be apparent to one skilled in the art that the present invention can be practiced without these specific details.

FIGS. 6 and 7 illustrate three exemplary matrices that can be used to generate routing matrices according to the present invention. FIGS. 8 and 9 provide a first specific example. FIGS. 10 and 11 provide a second specific example. The first and second specific examples are related to each other in a useful fashion, as is clarified below.

FIG. 6 illustrates a matrix called a "seed matrix". A seed matrix is an N×N (N by N) matrix of numerical values, where N is an integer greater than one. Each element of the seed matrix is a number that corresponds to an input signal of the routing matrix to be implemented. In the examples of FIGS. 6–11, N is thirteen. In other words, the signal values used in the seed matrix are 0, 1, 2, . . . , 11, and 12. However, other values of N can be used. For example, N can be any prime number greater than one. N can also be X to the power of Y, where X is any prime number and Y is any positive integer. In one embodiment, X is two, Y is three, and N is eight.

In seed matrix 600 of FIG. 6, each column of signal values 0–12 has an assigned letter A–M. This letter is used to designate the sub-matrix (e.g., the column of signal values) corresponding to the letter.

Note that no signal value occurs twice in any column. Further, no signal value occurs twice in any row. This ensures that the pattern of available interconnections in the resulting interconnect matrix is flexible, and that each input signal (corresponding to each signal value) has an equal number of possible connections to the available output signals.

FIG. 7 illustrates a generalized distribution matrix 701 that can be applied, for example, to seed matrix 600 of FIG. 6. However, distribution matrix 701 can also be applied to other seed matrices. Further, other distribution matrices can be applied to seed matrix 600. FIG. 7 also illustrates an adjustment matrix 702 that can be used in conjunction with distribution matrix 701 to produce a routing matrix pattern. Adjustment matrix 702 can be applied to distribution matrices other than matrix 701, and other adjustment matrices can be applied to distribution matrix 701.

A distribution matrix is a matrix of the sub-matrices from the seed matrix. In other words, each letter in distribution matrix 701 of FIG. 7 corresponds to an entire column of the seed matrix in FIG. 6. The seed matrix includes S rows and T columns of the sub-matrices, where S and T are integers greater than one. In a distribution matrix according to the present invention, each column of the distribution matrix differs from every other column of the distribution matrix in at least S–1 (S minus one) of the sub-matrices in the column. In other words, if any two columns in the distribution matrix have the same letter in the same row, then no two other rows can contain the same letter in both columns.

An adjustment matrix is a matrix having one row and T columns. In other words, the adjustment matrix is the same width as the distribution matrix. Each adjustment value in the adjustment matrix is an integral multiple of N. In the various example illustrated herein, the adjustment values are, in order from left to right, 0, N, 2N, 3N, . . . . However, the adjustment values can occur in any order, and multiples of N can be skipped, if desired. Because each signal value is simply a numerical designation of an input signal to the routing multiplexer, the exact numbers used to designate the signals are not important provided the other requirements of the invention are met.

In distribution matrix 701 and adjustment matrix 702, S is three and T has an undetermined value. By providing different values of T, a set of related routing matrices can be generated that can usefully share hardware and software design resources. An example of this application of the invention is shown in FIGS. 8–11.

FIG. 8 illustrates an exemplary distribution matrix 801 and adjustment matrix 802 that can be applied (for example) to seed matrix 600 of FIG. 6. Distribution matrix 801 is a 3×5 matrix, i.e., S is three and T is five. All thirteen sub-matrices A–M from seed matrix 600 of FIG. 6 are represented in distribution matrix 801. Sub-matrices A and B occur twice. As required, each column is different from each other column in at least two (S–1) of the sub-matrices. In fact, in distribution matrix 801, no two columns include any corresponding sub-matrices in the same positions.

Adjustment matrix 802 includes one adjustment value for each column of distribution matrix 801. Therefore, adjustment matrix 802 is a 1×T matrix. In adjustment matrix 802, the adjustment values follow the pattern 0, N, 2N, 3N, 4N.

FIG. 9 illustrates the routing matrix pattern 900 that results from the application of FIG. 8 to the seed matrix of FIG. 6. To generate the routing matrix pattern, the corresponding adjustment value for each column is added to each signal value in each sub-matrix in each column of the distribution matrix. For example, the area labeled "A" in FIG. 9 corresponds to sub-matrix A (the first column) in seed matrix 600 of FIG. 6. No adjustment has been made to these signal values, because the adjustment value for the first column of the distribution matrix is 0. As another example, the area labeled "F+13" in FIG. 9 includes the values of sub-matrix F, with the adjustment value of 13 added to each signal value in sub-matrix F. The adjustment value of 13 comes from the second column of adjustment matrix 802. Similarly, the area labeled "B+52", in FIG. 9 includes the values of sub-matrix B, with the adjustment value of 52 added to each signal value in sub-matrix B. The adjustment value of 52 comes from the fifth column of adjustment matrix 802.

Figures 2, 3:
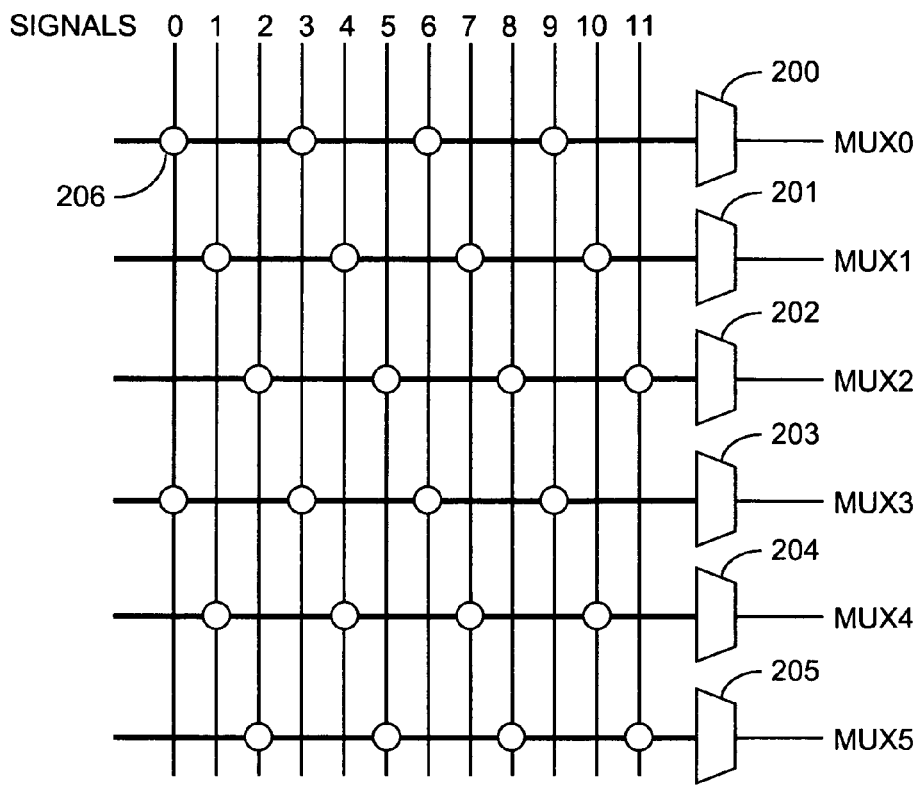
FIG. 2 illustrates a first routing matrix that might be used, for example, in the CPLD of FIG. 1.
FIG. 3 illustrates the routing matrix pattern for the routing matrix of FIG. 2.
Figures 4, 5:
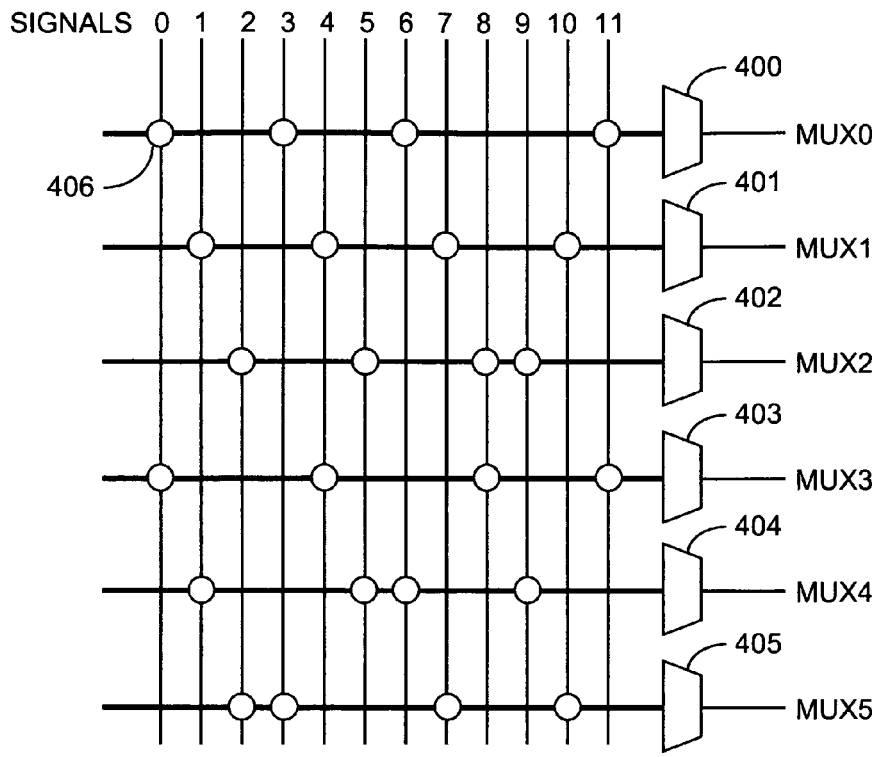
FIG. 4 illustrates a second routing matrix that might be used, for example, in the CPLD of FIG. 1.
FIG. 5 illustrates the routing matrix pattern for the routing matrix of FIG. 4.

Note that an extra column 901 of output signals MUX0–MUX38 is added at the left side of routing matrix pattern 900. When routing matrix pattern 900 is implemented in a routing matrix (e.g., using the method demonstrated in FIGS. 2–5), output signals MUX0–MUX38 can be implemented as programmable multiplexers, as shown in FIGS. 2 and 4. When implementing the routing matrix, each signal value in routing matrix pattern 900 corresponds to one of the input signals or input terminals 0–64, and each row of signal values in routing matrix pattern 900 corresponds to a set of the input terminals 0–64 coupled to a different one of the output terminals MUX0–MUX38. Thus, the routing matrix corresponding to the routing matrix pattern of FIG. 9 has 65 input terminals and 39 output terminals.

FIG. 10 illustrates second exemplary distribution and adjustment matrices that can be applied, for example, to the seed matrix of FIG. 6 to generate another routing matrix. The routing matrix generated in this second example is a superset of the routing matrix of FIGS. 8–9. Therefore, both the hardware (e.g., the layouts) and the software (e.g., routing software) for the two examples can be shared to a large extent. This sharing can simplify the task of implementing a set of related PLDs, e.g., a family of variously-sized CPLDs.

FIG. 10 illustrates an exemplary distribution matrix 1001 and adjustment matrix 1002 that can be applied (for example) to seed matrix 600 of FIG. 6. Distribution matrix 1001 is a 3×6 matrix. Note that distribution matrix 1001 is the same as distribution matrix 801, but with a new column added. In the exemplary embodiment, the new column is added at the right side of the distribution matrix. However, in other embodiments, the new column can be added anywhere in the distribution matrix. For ease of hardware and software implementation, the new column is preferably added at either the left side or the right side of the matrix.

The new column includes sub-matrices D, K, and C from seed matrix 600. Note that sub-matrix C occurs in the same position in the new column and the first column of distribution matrix 1001. However, it is permitted that any two columns exhibit a corresponding sub-matrix in one row (but not in more than one row). Sub-matrix D also occurs in the same position in the new column and the second column of distribution matrix 1001. Sub-matrix K also occurs in the same position in the new column and the fourth column of distribution matrix 1001. In each case, however, no second sub-matrix exhibits the same correspondence between the two columns. Therefore, distribution matrix 1001 fulfills the requirements for a distribution matrix.

Adjustment matrix 1002 includes one adjustment value for each column of distribution matrix 1001. Therefore, adjustment matrix 802 is a 1×6 matrix. Note that adjustment matrix 1002 is the same as adjustment matrix 802, but with a new column added. In the exemplary embodiment, the new column is added at the right side of the distribution matrix.

In other embodiments, the new column can be added anywhere in the adjustment matrix. Further, the new column need not be added in the same place as the new column in the distribution matrix. However, for ease of hardware and software implementation, the new column is preferably added at either the left side or the right side of the matrix, in the same location as the new column of the distribution matrix. In adjustment matrix 1002, the adjustment values follow the pattern 0, N, 2N, 3N, 4N, 5N.

FIG. 11 illustrates the routing matrix pattern 1100 that results from the application of FIG. 10 to the seed matrix of FIG. 6. To generate the routing matrix pattern, the corresponding adjustment value for each column is added to each signal value in each sub-matrix in each column of the distribution matrix. For example, the area labeled "C+65" in FIG. 11 includes the values of sub-matrix C, with the adjustment value of 65 added to each signal value in sub-matrix C. The adjustment value of 65 comes from the new (rightmost) column of adjustment matrix 1002.

Note that an extra column 1101 of output signals MUX0–MUX38 is added at the left side of routing matrix pattern 1100. When routing matrix pattern 1100 is implemented in a routing matrix using the method demonstrated in FIGS. 2–5, for example, output signals MUX0–MUX38 can be implemented as programmable multiplexers, as shown in FIGS. 2 and 4. When implementing the routing matrix, each signal value in routing matrix pattern 1100 corresponds to one of the input signals or terminals 0–77, and each row of signal values in routing matrix pattern 1100 corresponds to a set of the input terminals 0–77 coupled to a different one of the output terminals MUX0–MUX38. Thus, the routing matrix corresponding to the routing matrix pattern of FIG. 11 has 77 input terminals and 39 output terminals.

Note that the routing matrix pattern of FIG. 11 is a superset of the routing matrix pattern of FIG. 9. A set of PLDs can be created that include variously-sized routing matrices derived in this fashion. For example, a set of related PLDs can be created in which a first PLD includes the first four columns of routing matrix pattern 1101, a second PLD includes the first five columns of routing matrix pattern 1101, a third PLD corresponds to routing matrix pattern 1101, and a fourth PLD includes an additional seventh column (not shown) created by adding another column to distribution matrix 1001 and adjustment matrix 1002 of FIG. 10 and applying the new matrices to seed matrix 600 of FIG. 6.

FIG. 12 illustrates a set of related PLDs created by applying the methods of the present invention. In a first PLD, programmable logic blocks (LBs) 1201 are programmably interconnected by routing matrix (RM) 1202 via J input signal lines and K output signal lines. Routing matrix 1202 is generated from an N×N seed matrix, as described in the previous examples.

A second PLD includes logic blocks 1203 programmably interconnected by routing matrix 1204 via J+N input signal lines and K output signal lines. Routing matrix 1204 is a superset of routing matrix 1202. The routing matrix pattern for routing matrix 1204 includes an additional column also derived from the same seed matrix as the first PLD. Thus, routing matrix 1204 includes routing matrix 1202 plus additional programmable interconnections 1205. Note that the number of input signals from the logic blocks has increased by N relative to the first PLD.

A third PLD includes logic blocks 1206 programmably interconnected by routing matrix 1207 via J+2N input signal lines and K output signal lines. Routing matrix 1207 is a superset of routing matrix 1204. The routing matrix pattern for routing matrix 1207 includes an additional column also derived from the same seed matrix as the first and second PLDs. Thus, routing matrix 1207 includes routing matrix 1202 plus additional programmable interconnections 1205 and 1208. Note that the number of input signals from the logic blocks has increased by N relative to the second PLD.

Routing matrices 1202, 1204, and 1207 can be used to implement a set of PLDs including routing matrices of graduated sizes, as shown in FIG. 12. Hardware and software implementation of the resulting set of PLDs is simplified by maintaining this relationship between the variously-sized routing matrices.

Figure 13:
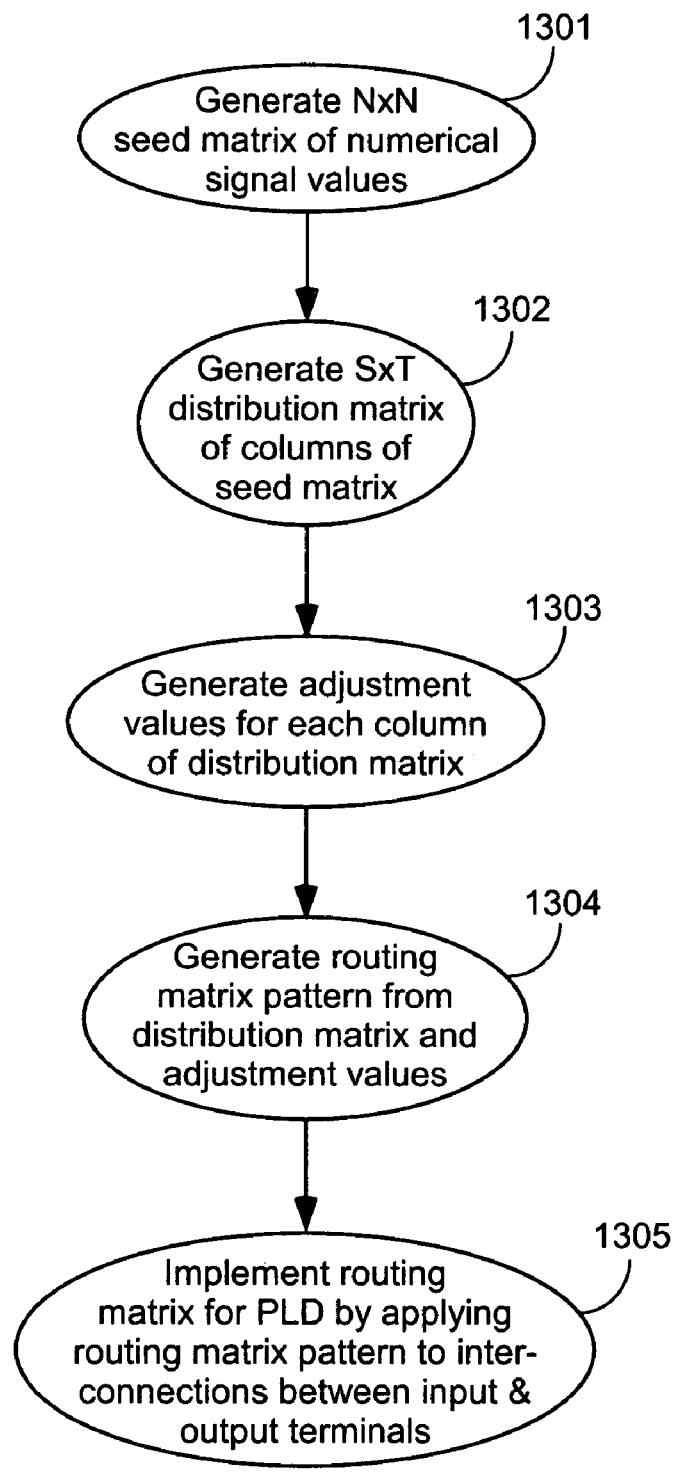
FIG. 13 illustrates the steps of an exemplary method of implementing a routing matrix for a programmable logic device (PLD).

FIG. 13 illustrates the steps of an exemplary method of implementing a routing matrix for a PLD, e.g., a CPLD. This method can be used, for example, to implement a routing matrix corresponding to the routing matrix patterns of FIG. 9 or 11.

In step 1301, a seed matrix is generated, e.g., as shown in FIG. 6. The seed matrix includes N rows and N columns of numerical signal values, where N is an integer greater than one. Each signal value appears at most once in each column and at most once in each row of the seed matrix. In some embodiments, each signal value appears exactly once in each column and exactly once in each row of the seed matrix. In some embodiments, N is a prime number (e.g., thirteen). In some embodiments, N equals X to the power of Y, where X is any prime number and Y is any positive integer. In one embodiment, X is two, Y is three, and N is eight.

In step 1302, a distribution matrix is generated, e.g., as shown in FIGS. 7, 8, and 10. The distribution matrix includes S rows and T columns of sub-matrices, where S and T are integers greater than one. Each column of the distribution matrix differs from each other column of the distribution matrix in at least (S–1) of the sub-matrices in the column. In one embodiment, S is three.

In step 1303, a corresponding adjustment value is generated for each column of the distribution matrix. Each adjustment value is an integral multiple of N. In some embodiments (e.g., in the embodiments of FIGS. 7, 8, and 10), an adjustment matrix is generated, each column including the corresponding adjustment value for a corresponding column of the distribution matrix. In some embodiments (e.g., the embodiments of FIGS. 7, 8, and 10), a first column in the distribution matrix has a corresponding adjustment value of 0, a second column in the distribution matrix has a corresponding adjustment value of N, a third column in the distribution matrix has a corresponding adjustment value of 2N, and so forth.

In step 1304, a routing matrix pattern is generated from the distribution matrix and the adjustment values, e.g., as shown in FIGS. 9 and 11. More specifically, the corresponding adjustment value is added to each signal value in each sub-matrix in each column of the distribution matrix.

In step 1305, a routing matrix for the PLD is implemented by applying the routing matrix pattern to provide programmable interconnections between input terminals and output terminals of the routing matrix (e.g., in a fashion similar to that of FIGS. 2–5). Each signal value in the routing matrix pattern corresponds to one of the input terminals. Each row of signal values in the routing matrix pattern corresponds to a set of the input terminals programmably coupled to a different one of the output terminals.

Figure 14:
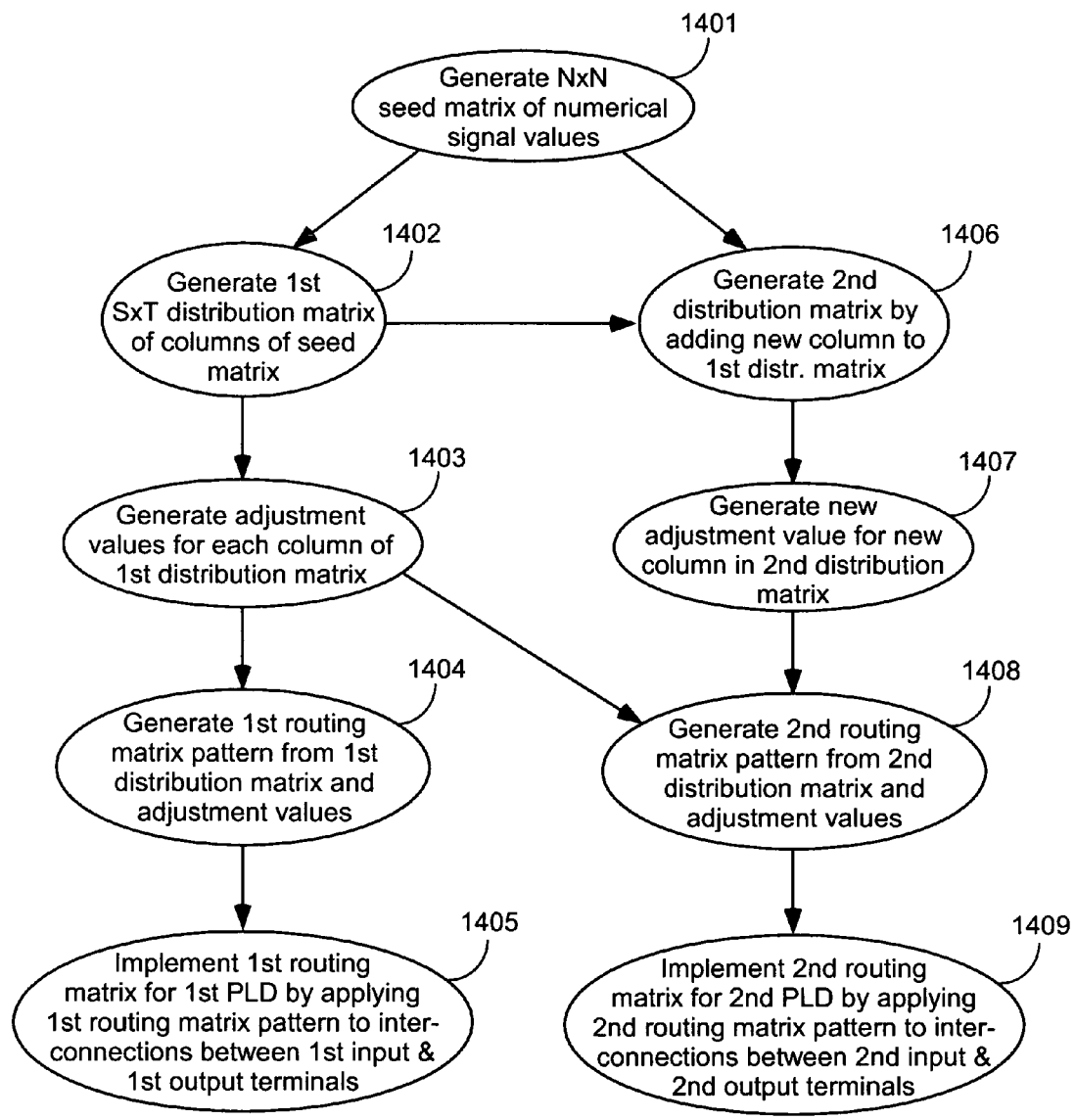
FIG. 14 illustrates the steps of a first exemplary method of implementing a set of PLDs according to another aspect of the present invention.

FIG. 14 illustrates the steps of a first exemplary method of implementing a set of PLDs according to another aspect of the present invention. This method can also be used, for example, to implement the routing matrices corresponding to the routing matrix patterns of FIGS. 9 and 11, and/or the set of PLDs illustrated in FIG. 12.

In step 1401, a seed matrix is generated, e.g., as shown in FIG. 6. The seed matrix includes N rows and N columns of numerical signal values, where N is an integer greater than one. Each signal value appears at most once in each column and at most once in each row of the seed matrix. In some embodiments, each signal value appears exactly once in each column and exactly once in each row of the seed matrix. In some embodiments, N is a prime number (e.g., thirteen). In some embodiments, N equals X to the power of Y, where X is any prime number and Y is any positive integer. In one embodiment, X is two, Y is three, and N is eight.

In step 1402, a first distribution matrix is generated, e.g., as shown in FIG. 8. The first distribution matrix includes S rows and T columns of sub-matrices, where S and T are integers greater than one. Each column of the first distribution matrix differs from each other column of the first distribution matrix in at least (S–1) of the sub-matrices in the column. In the embodiment of FIG. 8, S is three and T is five.

In step 1403, a corresponding adjustment value is generated for each column of the first distribution matrix. Each adjustment value is an integral multiple of N. In some embodiments (e.g., in the embodiment of FIG. 8), a first adjustment matrix is generated, each column including the corresponding adjustment value for a corresponding column of the first distribution matrix. In some embodiments (e.g., the embodiment of FIG. 8), a first column in the first distribution matrix has a corresponding adjustment value of 0, a second column in the first distribution matrix has a corresponding adjustment value of N, a third column in the first distribution matrix has a corresponding adjustment value of 2N, and so forth.

In step 1404, a first routing matrix pattern is generated from the first distribution matrix and the adjustment values associated with each column of the first distribution matrix, e.g., as shown in FIG. 9. More specifically, the corresponding adjustment value is added to each signal value in each sub-matrix in each column of the first distribution matrix.

In step 1405, a first routing matrix for a first PLD is implemented by applying the first routing matrix pattern to provide programmable interconnections between first input terminals and first output terminals of the first routing matrix (e.g., in a fashion similar to that of FIGS. 2–5). Each signal value in the first routing matrix pattern corresponds to one of the first input terminals. Each row of signal values in the first routing matrix pattern corresponds to a set of the first input terminals programmably coupled to a different one of the first output terminals.

Step 1406 can be performed at any time after the generation of the first distribution matrix. In step 1406, a second distribution matrix is generated by adding a new column of the sub-matrices to the first distribution matrix. The new column differs from each column of the first distribution matrix in at least (S–1) of the sub-matrices in the new column. For example, comparing the distribution matrices of FIGS. 8 and 10, the new column in FIG. 10 includes the sub-matrices D, K, and C. Note that while each of D, K, and C appears in one other column in the distribution matrix, no two of the new sub-matrices occur in the same positions in any of the other columns.

In step 1407, a new adjustment value is generated for the new column of the second distribution matrix. The new adjustment value is an integral multiple of N. In some embodiments, the new adjustment value is N greater than the largest adjustment value of the first distribution matrix. For example, comparing the adjustment matrices of FIGS. 8 and 10, the new adjustment value is 65.

Step 1408 can be performed at any time after generating the second distribution matrix, the new adjustment value, and the adjustment values for the first distribution matrix. In step 1408, a second routing matrix pattern is generated from the second distribution matrix and the adjustment values corresponding to each column.

In step 1409, a second routing matrix for a second PLD is implemented by applying the second routing matrix pattern to provide programmable interconnections between second input terminals and second output terminals of the second routing matrix (e.g., in a fashion similar to that of FIGS. 2–5). Each signal value in the second routing matrix pattern corresponds to one of the second input terminals. Each row of signal values in the second routing matrix pattern corresponds to a set of the second input terminals programmably coupled to a different one of the second output terminals.

The two routing matrices generated by following the series of steps in FIG. 14 are closely related to one another. In fact, such a process can be used to generate routing matrices 1202 and 1204, or routing matrices 1204 and 1207, of FIG. 12. As described in connection with FIG. 12, hardware and software implementation of the resulting set of PLDs is simplified by maintaining this relationship between the variously-sized routing matrices.

Figure 15:
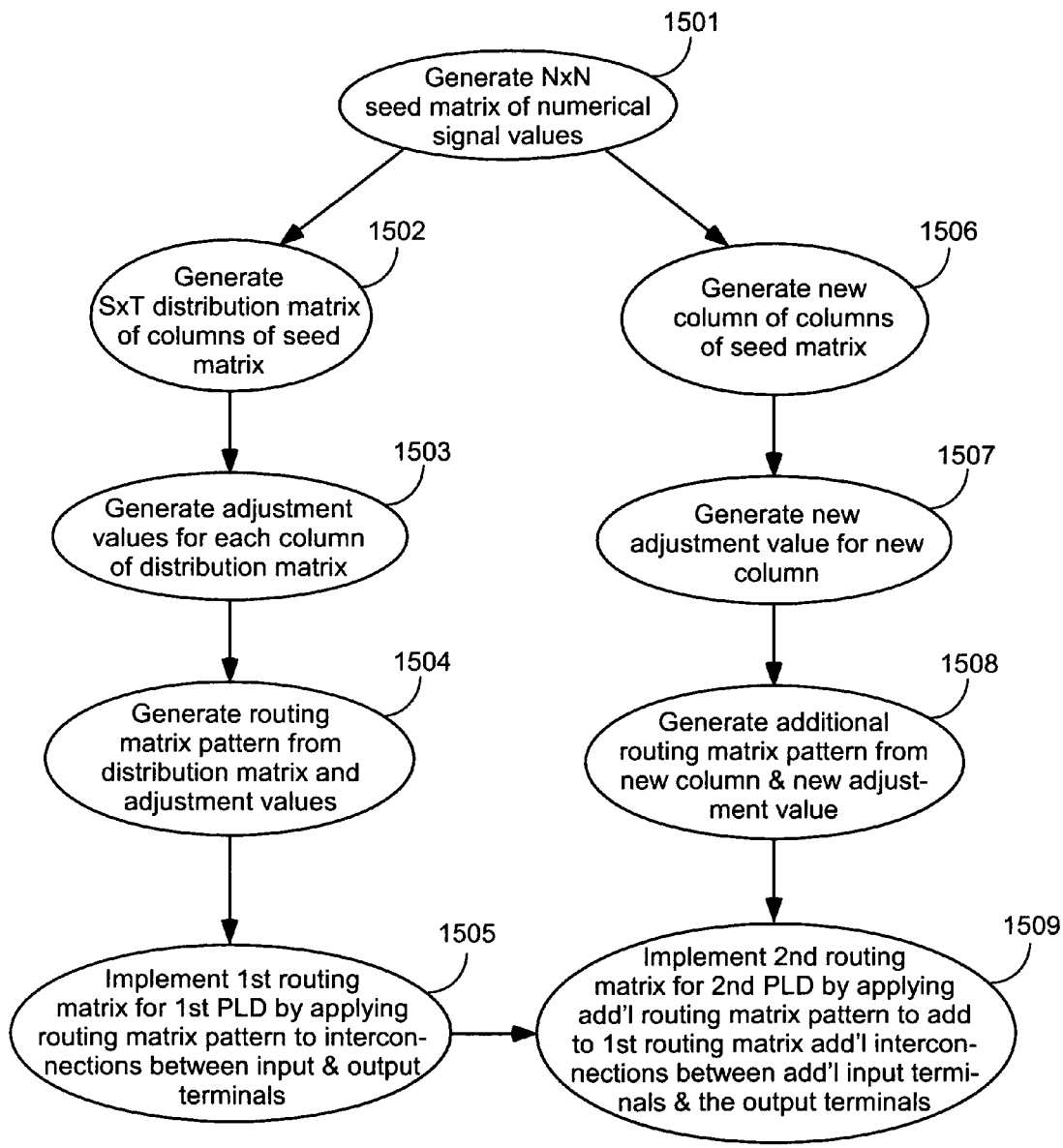
FIG. 15 illustrates the steps of a second exemplary method of implementing a set of PLDs according to yet another aspect of the present invention.

The method of FIG. 14 can be simplified, for example, as shown in FIG. 15. FIG. 15 illustrates the steps of a second exemplary method of implementing a set of PLDs according to yet another aspect of the present invention. This method can also be used, for example, to implement the routing matrices corresponding to the routing matrix patterns of FIGS. 9 and 11, and/or the set of PLDs illustrated in FIG. 12. The method of FIG. 15 differs from the method of FIG. 14 in that no full-size second distribution matrix is generated. Instead, the second routing matrix is generated directly from the first routing matrix and from an additional routing matrix pattern derived from a new column and a new adjustment value. This method reduces the effort involved in layout out the second routing matrix, for example.

In step 1501, a seed matrix is generated, e.g., as shown in FIG. 6. The seed matrix includes N rows and N columns of numerical signal values, where N is an integer greater than one. Each signal value appears at most once in each column and at most once in each row of the seed matrix. In some embodiments, each signal value appears exactly once in each column and exactly once in each row of the seed matrix. In some embodiments, N is a prime number (e.g., thirteen). In some embodiments, N equals X to the power of Y, where X is any prime number and Y is any positive integer. In one embodiment, X is two, Y is three, and N is eight.

In step 1502, a distribution matrix is generated, e.g., as shown in FIG. 8. The distribution matrix includes S rows and T columns of sub-matrices, where S and T are integers greater than one. Each column of the distribution matrix differs from each other column of the distribution matrix in at least (S–1) of the sub-matrices in the column. In the embodiment of FIG. 8, S is three and T is five.

In step 1503, a corresponding adjustment value is generated for each column of the distribution matrix. Each adjustment value is an integral multiple of N. In some embodiments (e.g., in the embodiment of FIG. 8), an adjustment matrix is generated, each column including the corresponding adjustment value for a corresponding column of the distribution matrix. In some embodiments (e.g., the embodiment of FIG. 8), a first column in the distribution matrix has a corresponding adjustment value of 0, a second column in the distribution matrix has a corresponding adjustment value of N, a third column in the distribution matrix has a corresponding adjustment value of 2N, and so forth.

In step 1504, a routing matrix pattern is generated from the distribution matrix and the adjustment values associated with each column of the distribution matrix, e.g., as shown in FIG. 9. More specifically, the corresponding adjustment value is added to each signal value in each sub-matrix in each column of the distribution matrix.

In step 1505, a first routing matrix for the PLD is implemented by applying the routing matrix pattern to provide programmable interconnections between input terminals and output terminals of the first routing matrix (e.g., in a fashion similar to that of FIGS. 2–5). Each signal value in the routing matrix pattern corresponds to one of the input terminals. Each row of signal values in the routing matrix pattern corresponds to a set of the input terminals programmably coupled to a different one of the output terminals.

Step 1506 can be performed at any time after the generation of the seed matrix. In step 1506, a new column is generated of the sub-matrices to the distribution matrix. The new column differs from each column of the distribution matrix in at least (S−1) of the sub-matrices in the new column. Note that this limitation can be met irregardless of the order in which the distribution matrix and the new column are generated.

In step 1507, a new adjustment value is generated for the new column. The new adjustment value is an integral multiple of N. In some embodiments, the new adjustment value is N greater than the largest adjustment value of the distribution matrix.

In step 1508, an additional routing matrix pattern is generated from the new column and the new adjustment value. Therefore, the additional routing matrix pattern includes only one signal value in each row.

In step 1509, a second routing matrix for the second PLD is implemented by applying the additional routing matrix pattern to add to the first routing matrix additional interconnections between newly added input terminals and the existing output terminals. Each signal value in the additional routing matrix pattern corresponds to one of the newly added input terminals programmably coupled to a different one of the existing output terminals.

The two routing matrices generated by following the series of steps in FIG. 15 can be, for example, the same as two routing matrices generated by following the steps illustrated in FIG. 14. For example, the method illustrated in FIG. 15 can be used to generate two routing matrices corresponding to the routing patterns illustrated in FIGS. 9 and 11.

Those having skill in the relevant arts of the invention will now perceive various modifications and additions that can be made as a result of the disclosure herein. For example, referring to FIG. 14, the second routing matrix pattern can be generated by simply taking the first routing matrix pattern and adding another column derived from the new column of the second distribution matrix and the new adjustment value. This and other variations on the methods of the invention are encompassed thereby. As another example, the above text describes the circuits and methods of the invention in the context of Complex Programmable Logic Devices (CPLDs). However, methods of the invention can also be applied to other programmable logic devices (PLDs) that include routing multiplexers.

Accordingly, all such modifications and additions are deemed to be within the scope of the invention, which is to be limited only by the appended claims and their equivalents.

What is claimed is:

1. A method of implementing a routing matrix for a programmable logic device (PLD), the method comprising:
    generating a seed matrix comprising N rows and N columns of numerical signal values, wherein N is an integer greater than one, each signal value appearing at most once in each column and at most once in each row of the seed matrix;
    generating a distribution matrix comprising S rows and T columns of sub-matrices, wherein S and T are integers greater than one and each sub-matrix corresponds to a column of the seed matrix, each column of the distribution matrix differing from each other column of the distribution matrix in at least (S−1) of the sub-matrices in the column;
    generating a corresponding adjustment value for each column of the distribution matrix, each adjustment value being an integral multiple of N;
    generating a routing matrix pattern by adding the corresponding adjustment value to each signal value in each sub-matrix in each column of the distribution matrix; and
    implementing the routing matrix for the PLD by applying the routing matrix pattern to provide programmable interconnections between a plurality of input terminals and a plurality of output terminals of the routing matrix, each signal value in the routing matrix pattern corresponding to one of the input terminals, each row of signal values in the routing matrix pattern corresponding to a set of the input terminals programmably coupled to a different one of the output terminals.

2. The method of claim 1, wherein generating a corresponding adjustment value for each column of the distribution matrix comprises generating an adjustment matrix wherein each column comprises the corresponding adjustment value for a corresponding column of the distribution matrix.

3. The method of claim 1, wherein each signal value appears exactly once in each column and exactly once in each row of the seed matrix.

4. The method of claim 1, wherein N is a prime number.

5. The method of claim 4, wherein N is thirteen.

6. The method of claim 1, wherein N equals X to the power of Y, where X is a prime number and Y is a positive integer.

7. The method of claim 6, wherein X is two, Y is three, and N is eight.

8. The method of claim 1, wherein S is three.

9. The method of claim 1, wherein a first column in the distribution matrix has a corresponding adjustment value of 0, a second column in the distribution matrix has a corresponding adjustment value of N, and a third column in the distribution matrix has a corresponding adjustment value of 2N.

10. The method of claim 1, wherein the PLD is a Complex Programmable Logic Device (CPLD).

11. A routing matrix for a programmable logic device (PLD), comprising:
    a plurality of input terminals;
    a plurality of output terminals; and
    a plurality of programmable interconnections between the input terminals and the output terminals, the programmable interconnections conforming to a routing matrix pattern comprising an array of numerical signal values, each signal value in the routing matrix pattern corresponding to one of the input terminals, each row of signal values in the routing matrix pattern corresponding to a set of the input terminals programmably coupled to a different one of the output terminals, wherein the routing matrix pattern is produced by the process of:

generating a seed matrix comprising N rows and N columns of the signal values, wherein N is an integer greater than one, each signal value appearing at most once in each column and at most once in each row of the seed matrix;

generating a distribution matrix comprising S rows and T columns of sub-matrices, wherein S and T are integers greater than one and each sub-matrix corresponds to a column of the seed matrix, each column of the distribution matrix differing from each other column of the distribution matrix in at least (S−1) of the sub-matrices in the column;

generating a corresponding adjustment value for each column of the distribution matrix, each adjustment value being an integral multiple of N; and generating the routing matrix pattern by adding the corresponding adjustment value to each signal value in each sub-matrix in each column of the distribution matrix.

12. The routing matrix of claim 11, wherein generating a corresponding adjustment value for each column of the distribution matrix comprises generating an adjustment matrix wherein each column comprises the corresponding adjustment value for a corresponding column of the distribution matrix.

13. The routing matrix of claim 11, wherein each signal value appears exactly once in each column and exactly once in each row of the seed matrix.

14. The routing matrix of claim 11, wherein N is a prime number.

15. The routing matrix of claim 14, wherein N is thirteen.

16. The routing matrix of claim 11, wherein N equals X to the power of Y, where X is a prime number and Y is a positive integer.

17. The routing matrix of claim 16, wherein X is two, Y is three, and N is eight.

18. The routing matrix of claim 11, wherein S is three.

19. The routing matrix of claim 11, wherein a first column in the distribution matrix has a corresponding adjustment value of 0, a second column in the distribution matrix has a corresponding adjustment value of N, and a third column in the distribution matrix has a corresponding adjustment value of 2N.

20. The routing matrix of claim 11, wherein the PLD is a Complex Programmable Logic Device (CPLD).

21. A programmable logic device (PLD), comprising:
a plurality of programmable logic blocks; and
a routing matrix programmably interconnecting the logic blocks, the routing matrix comprising:
a plurality of input terminals coupled to at least a first subset of the logic blocks;
a plurality of output terminals coupled to at least a second subset of the logic blocks; and
a plurality of programmable interconnections between the input terminals and the output terminals, the programmable interconnections conforming to a routing matrix pattern comprising an array of numerical signal values, each signal value in the routing matrix pattern corresponding to one of the input terminals, each row of signal values in the routing matrix pattern corresponding to a set of the input terminals programmably coupled to a different one of the output terminals, wherein the routing matrix pattern is produced by the process of:

generating a seed matrix comprising N rows and N columns of the signal values, wherein N is an integer greater than one, each signal value appearing at most once in each column and at most once in each row of the seed matrix;

generating a distribution matrix comprising S rows and T columns of sub-matrices, wherein S and T are integers greater than one and each sub-matrix corresponds to a column of the seed matrix, each column of the distribution matrix differing from each other column of the distribution matrix in at least (S−1) of the sub-matrices in the column;

generating a corresponding adjustment value for each column of the distribution matrix, each adjustment value being an integral multiple of N; and generating the routing matrix pattern by adding the corresponding adjustment value to each signal value in each sub-matrix in each column of the distribution matrix.

22. The PLD of claim 21, wherein generating a corresponding adjustment value for each column of the distribution matrix comprises generating an adjustment matrix wherein each column comprises the corresponding adjustment value for a corresponding column of the distribution matrix.

23. The PLD of claim 21, wherein each signal value appears exactly once in each column and exactly once in each row of the seed matrix.

24. The PLD of claim 21, wherein N is a prime number.

25. The PLD of claim 24, wherein N is thirteen.

26. The PLD of claim 21, wherein N equals X to the power of Y, where X is a prime number and Y is a positive integer.

27. The PLD of claim 26, wherein X is two, Y is three, and N is eight.

28. The PLD of claim 21, wherein S is three.

29. The PLD of claim 21, wherein a first column in the distribution matrix has a corresponding adjustment value of 0, a second column in the distribution matrix has a corresponding adjustment value of N, and a third column in the distribution matrix has a corresponding adjustment value of 2N.

30. The PLD of claim 21, wherein the PLD is a Complex Programmable Logic Device (CPLD).

31. A method of implementing a set of programmable logic devices (PLDs), each PLD in the set including a plurality of programmable logic blocks and a routing matrix programmably interconnecting the logic blocks, the method comprising:

generating a seed matrix comprising N rows and N columns of numerical signal values, wherein N is an integer greater than one, each signal value appearing at most once in each column and at most once in each row of the seed matrix;

generating a first distribution matrix comprising S rows and T columns of sub-matrices, wherein S and T are integers greater than one and each sub-matrix corresponds to a column of the seed matrix, each column of the first distribution matrix differing from each other column of the first distribution matrix in at least (S−1) of the sub-matrices in the column;

generating a corresponding adjustment value for each column of the first distribution matrix, each adjustment value being an integral multiple of N;

generating a first routing matrix pattern by adding the corresponding adjustment value to each signal value in each sub-matrix in each column of the first distribution matrix;

implementing a first routing matrix for a first PLD in the set of PLDs by applying the first routing matrix pattern to provide programmable interconnections between a plurality of first input terminals and a plurality of first output terminals of the first routing matrix, each signal value in the first routing matrix pattern corresponding to one of the first input terminals, each row of signal values in the first routing matrix pattern corresponding to a set of the first input terminals programmably coupled to a different one of the first output terminals;

generating a second distribution matrix by adding a new column of the sub-matrices to the first distribution matrix, the new column differing from each column of the first distribution matrix in at least (S−1) of the sub-matrices in the new column;

generating a new adjustment value corresponding to the new column of the second distribution matrix, the new adjustment value being an integral multiple of N;

generating a second routing matrix pattern by adding the corresponding adjustment value to each signal value in each sub-matrix in each column of the second distribution matrix; and implementing a second routing matrix for a second PLD in the set of PLDs by applying the second routing matrix pattern to provide programmable interconnections between a plurality of second input terminals and a plurality of second output terminals of the second routing matrix, each signal value in the second routing matrix pattern corresponding to one of the second input terminals, each row of signal values in the second routing matrix pattern corresponding to a set of the second input terminals programmably coupled to a different one of the second output terminals.

32. The method of claim 31, wherein the new adjustment value differs from the corresponding adjustment values for each column of the first distribution matrix.

33. The method of claim 31, wherein N is thirteen, S is three, and T is five.

34. The method of claim 31, wherein the PLD is a Complex Programmable Logic Device (CPLD).

35. A method of implementing a set of programmable logic devices (PLDs), each PLD in the set including a plurality of programmable logic blocks and a routing matrix programmably interconnecting the logic blocks, the method comprising:

generating a seed matrix comprising N rows and N columns of numerical signal values, wherein N is an integer greater than one, each signal value appearing at most once in each column and at most once in each row of the seed matrix;

generating a distribution matrix comprising S rows and T columns of sub-matrices, wherein S and T are integers greater than one and each sub-matrix corresponds to a column of the seed matrix, each column of the distribution matrix differing from each other column of the distribution matrix in at least (S−1) of the sub-matrices in the column;

generating a corresponding adjustment value for each column of the distribution matrix, each adjustment value being an integral multiple of N;

generating a routing matrix pattern by adding the corresponding adjustment value to each signal value in each sub-matrix in each column of the distribution matrix;

implementing a first routing matrix for a first PLD in the set of PLDs by applying the routing matrix pattern to provide programmable interconnections between a plurality of input terminals and a plurality of output terminals of the first routing matrix, each signal value in the routing matrix pattern corresponding to one of the input terminals, each row of signal values in the routing matrix pattern corresponding to a set of the input terminals programmably coupled to a different one of the output terminals;

generating a new column of the sub-matrices, the new column differing from each column of the distribution matrix in at least (S−1) of the sub-matrices in the new column;

generating a new adjustment value for the new column, the new adjustment value being an integral multiple of N;

generating an additional routing matrix pattern by adding the new adjustment value to each signal value in each sub-matrix in the new column; and implementing a second routing matrix for a second PLD in the set of PLDs by applying the additional routing matrix pattern to add to the first routing matrix additional interconnections between an additional plurality of input terminals and the output terminals, each signal value in the additional routing matrix pattern corresponding to one of the additional input terminals programmably coupled to a different one of the output terminals.

36. The method of claim 35, wherein the new adjustment value differs from the corresponding adjustment values for each column of the distribution matrix.

37. The method of claim 35, wherein N is thirteen, S is three, and T is five.

38. The method of claim 35, wherein the PLD is a Complex Programmable Logic Device (CPLD).

* * * * *